US009245874B2

(12) United States Patent
Demuynck

(10) Patent No.: US 9,245,874 B2
(45) Date of Patent: Jan. 26, 2016

(54) LED ARRAY HAVING EMBEDDED LED AND METHOD THEREFOR

(75) Inventor: Randolph Cary Demuynck, Wake Forest, NC (US)

(73) Assignee: CREE, INC., Durham, NC (US)

( * ) Notice: Subject to any disclaimer, the term of this patent is extended or adjusted under 35 U.S.C. 154(b) by 133 days.

(21) Appl. No.: 13/088,693

(22) Filed: Apr. 18, 2011

(65) Prior Publication Data

US 2012/0261680 A1 Oct. 18, 2012

(51) Int. Cl.
- H01L 33/08 (2010.01)
- H01L 33/50 (2010.01)
- H01L 25/075 (2006.01)
- H01L 33/60 (2010.01)
- H01L 33/62 (2010.01)
- H01L 33/64 (2010.01)

(52) U.S. Cl.
CPC .............. *H01L 25/0753* (2013.01); *H01L 33/50* (2013.01); *H01L 33/60* (2013.01); *H01L 33/62* (2013.01); *H01L 33/64* (2013.01); *H01L 2924/0002* (2013.01); *H01L 2933/0091* (2013.01)

(58) Field of Classification Search
CPC ................. H01L 25/0753; H01L 2924/12041; H01L 33/54; H01L 33/60; H01L 31/0203; H01L 31/048; H01L 2224/48137; H01L 24/96; H01L 27/14623; H01L 27/14678; H01L 27/3234; H01L 24/97
USPC ........... 257/88, 98, 80, 760, E31.117, E33.04
See application file for complete search history.

(56) References Cited

U.S. PATENT DOCUMENTS

| 6,354,714 | B1 | 3/2002 | Rhodes |
| 6,730,533 | B2 | 5/2004 | Durocher et al. |
| 6,821,804 | B2 | 11/2004 | Thibeault et al. |
| 6,921,183 | B2 | 7/2005 | Yang et al. |
| 7,213,940 | B1 | 5/2007 | Van De Ven et al. |
| 7,335,551 | B2 | 2/2008 | Sheats |
| 7,528,482 | B2 | 5/2009 | Huang et al. |
| 7,723,829 | B2 | 5/2010 | Su et al. |
| 7,821,023 | B2 | 10/2010 | Yuan et al. |
| 2004/0228107 | A1 | 11/2004 | Lee et al. |
| 2006/0261364 | A1 | 11/2006 | Suehiro et al. |
| 2008/0055863 | A1* | 3/2008 | Cho et al. ...................... 361/711 |
| 2008/0179611 | A1 | 7/2008 | Chitnis et al. |
| 2008/0272941 | A1* | 11/2008 | Jackson et al. ................ 341/110 |
| 2009/0108281 | A1 | 4/2009 | Keller et al. |

(Continued)

FOREIGN PATENT DOCUMENTS

| CN | WO 2010/135994 | * 12/2010 |
| WO | WO 2010/135994 | 12/2010 |

OTHER PUBLICATIONS

Takahashi et al., "High-Density LED Display Panel on Silicon Microreflector and Integrated Circuit", Electronic Manufacturing Technology Symposium, Japan, Dec. 4, 1995, pp. 272-275, XP010195599.

International Search Report and Written Opinion of the International Searching Committee, PCT/US2012/033475, completed Jul. 5, 2012.

International Preliminary Report on Patentability, PCT/US2012/033475, filed Apr. 13, 2012.

(Continued)

*Primary Examiner* — Cathy N Lam
(74) *Attorney, Agent, or Firm* — Brinks Gilson & Lione

(57) ABSTRACT

An LED array comprises a base layer, at least one LED disposed on the base layer, and a diffusion layer including a luminescent material. The diffusion layer covers the at least one LED and the base layer in such a way that light emitted from the at least one LED passes through the diffusion layer.

24 Claims, 3 Drawing Sheets

(56) References Cited

U.S. PATENT DOCUMENTS

| | | | |
|---|---|---|---|
| 2009/0322800 A1* | 12/2009 | Atkins | 345/690 |
| 2010/0046217 A1* | 2/2010 | Ngai | 362/235 |
| 2010/0163892 A1 | 7/2010 | Liu | |
| 2011/0001149 A1 | 1/2011 | Chan et al. | |
| 2011/0149554 A1* | 6/2011 | Ouderkirk et al. | 362/97.1 |
| 2012/0069567 A1* | 3/2012 | Wu | 362/235 |
| 2012/0094406 A1 | 4/2012 | Patel et al. | |
| 2013/0200528 A1* | 8/2013 | Lin et al. | 257/774 |

OTHER PUBLICATIONS

Office Action, U.S. Appl. No. 13/417,972, filed Mar. 12, 2012, mailed Apr. 11, 2013.

Final Office Action, U.S. Appl. No. 13/417,972, filed Mar. 12, 2012, mailed Aug. 15, 2013.

Office Action, U.S. Appl. No. 13/417,972, filed Mar. 12, 2012, mailed Oct. 1, 2014.

\* cited by examiner

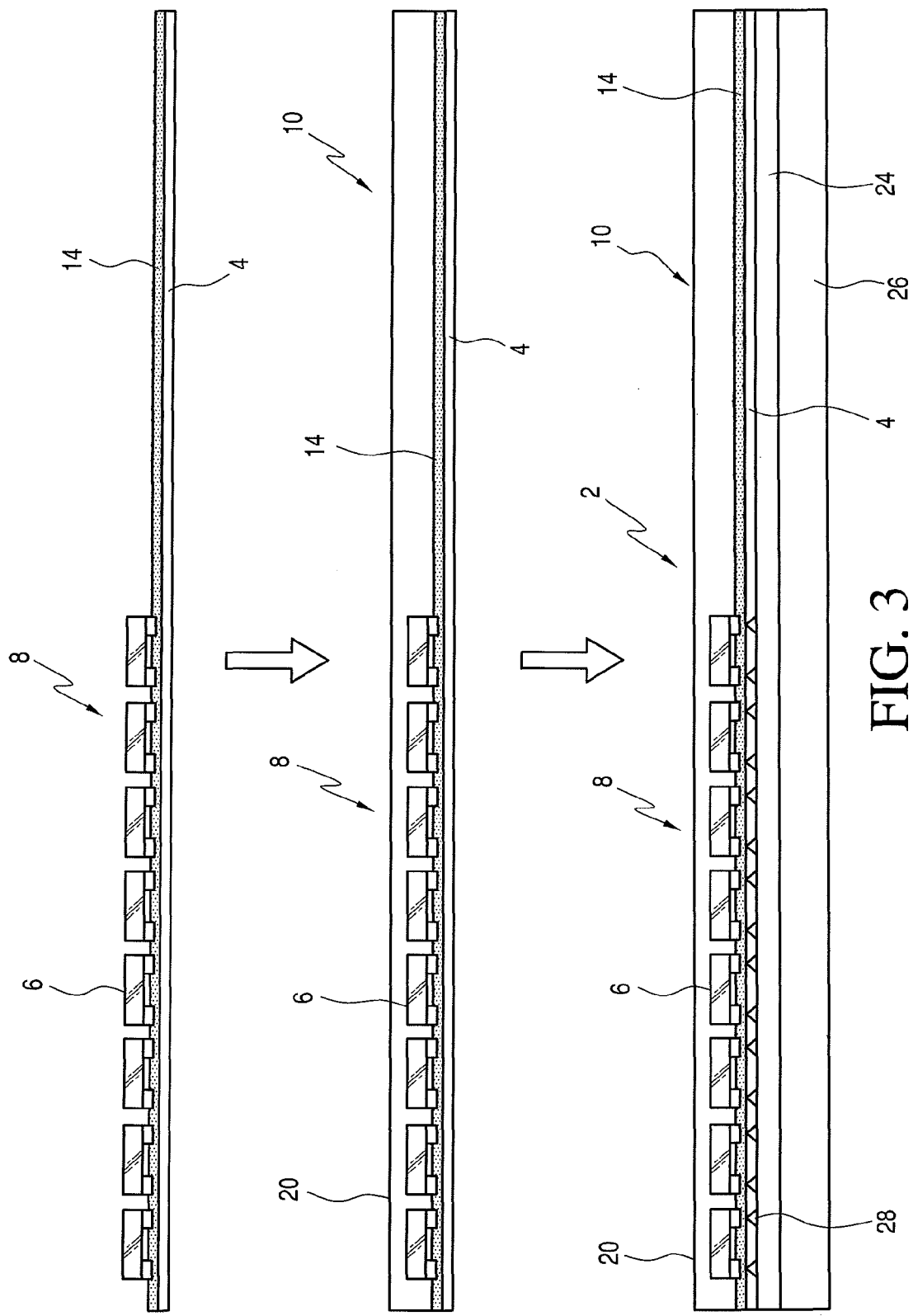

LED ARRAY HAVING EMBEDDED LED AND METHOD THEREFOR

FIELD OF INVENTION

This invention relates to light emitting diodes (LED or LEDs) and in particular to LED packages having an LED embedded within the package.

BACKGROUND

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In LED package design, two challenges are thermal management and size. In an exemplary conventional surface mount design, an LED or LED array is mounted onto a printed circuit board, with wire bonding present for each individual LED; the circuit board is mounted to a heat sink; and the heat sink is mounted to a fixture housing, along with needed drive electronics. Additional optics or components may be needed. Spacing between each individual LED in an array is dictated by the presence of the wire bond (i.e., there is a limit to how close together the LEDs may be). There is a continuous drive to reduce the size of LED packages to facilitate more widespread use of LEDs.

It is known that thermal management is a concern with electronic packages, whether containing integrated circuits or discrete components such as diodes or power transistors. It is also known that excessive heat may cause LED failures. Thus, one of the considerations for designing LED packages is effective thermal management. One of the objectives of effective thermal management in the design of electronic packaging is to maintain the operating temperature of the LEDs and other active circuit components at an appropriately low enough temperature to prevent premature component failure. Various cooling strategies including conduction heat transfer are in common use. However, high intensity LEDs that emit light principally in the visible part of the electromagnetic spectrum can generate significant amounts of heat that is difficult to dissipate using conventional techniques.

The design considerations of reducing the size of an LED package and maintaining a relatively low operating temperature are to some extent competitive with each other. It is desirable to develop an LED package that addresses these design considerations.

BRIEF SUMMARY

In an aspect of the present invention, an LED array comprises a base layer, at least one LED disposed on the base layer, and a diffusion layer including a luminescent material. The diffusion layer covers the at least one LED and the base layer in such a way that light emitted from the at least one LED passes through the diffusion layer.

In a feature of the aspect, the diffusion layer comprises a transparent material having a luminescent material dispersed therein. The luminescent material may comprise a phosphor. In another feature of the aspect, the LED array comprises a glue layer bonding the at least one LED to the base layer, wherein the glue layer overlies the base layer. The glue layer may comprise a reflective material. The base layer may comprise copper foil. The at least one LED may comprise an array of LEDs.

In another feature, spacing between the LEDs in the array is between about 40 microns to about 100 microns. In yet another feature, the diffusion layer comprises transparent epoxy resin having phosphor dispersed therein. In a further feature, the base layer has a micro via residing therein.

In an additional feature, the LED array further comprises a substrate layer disposed below and in contact with the base layer in the array. A component may be embedded in the substrate layer. The component may comprise driver circuitry.

In another feature, the LED array further comprises a ground plane. In a further feature, the LED array is a printed circuit board with at least one LED embedded therein. In an additional feature, a surface effect resides on a surface of the diffusion layer such that the array produces a predetermined light output. The surface effect may comprise a roughened surface region. The surface effect may comprise a surface pattern.

In another aspect of the invention, a process for manufacturing an LED array, comprises providing a base layer, placing at least one LED on the base layer, and placing a diffusion layer in covering relation to the at least one LED and the base layer. The diffusion layer comprises a transparent material including a luminescent material dispersed therein.

In a feature of this aspect, the process further comprises drilling a micro via in the base layer. In another feature, the process further comprises adding a substrate layer to the LED array, wherein the substrate layer is disposed below and in contact with the base layer. In yet another feature, the process further comprises adding a ground layer to the LED array, wherein the ground layer is disposed below and in contact with the substrate layer. The substrate layer may include a component embedded therein. The component may comprise driver circuitry.

In another feature of the aspect, the process further comprises adding a ground layer to the LED array, wherein the ground layer is in contact with and below the base layer. In a further feature, the LED array comprises a printed circuit board having at least one LED embedded therein. The at least one LED may be bonded to the base layer by a glue layer overlying the base layer. The glue layer may comprise a reflective material. The luminescent material may comprises phosphor.

BRIEF DESCRIPTION OF THE DRAWINGS

The accompanying drawings are included to provide a further understanding of the invention and are incorporated in and constitute a part of this application. The drawings illustrate certain embodiment(s) of the invention. In the drawings:

FIG. 3 is a schematic representation of a process for manufacturing a light emitting array in accordance with the present invention.

DETAILED DESCRIPTION

Figure 1:
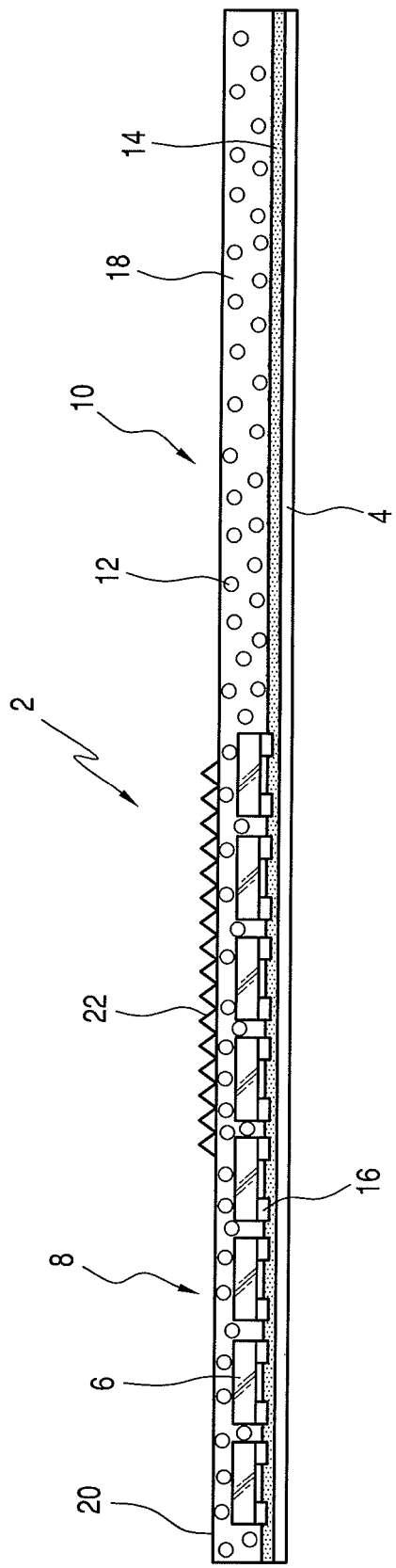
FIG. 1 is a side view schematic representation of an embodiment of a light emitting array in accordance with the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Reference is now made to FIG. 1. FIG. 1 is a side view schematic representation of an embodiment of a light emitting array in accordance with the present invention. In the embodiment of FIG. 1, the light emitting array 2 comprises a base layer 4, an array 8 of LEDs 6 disposed on the base layer 4, and a diffusion layer 10 covering the LED array 8 and the base layer 4. The diffusion layer 10 includes a luminescent material 12 and covers the LED array 8 in such a way that light emitted from the LED array 8 passes through the diffusion layer 10.

Conventionally, LEDs are mounted to the surface of a substrate/base layer. For example, LEDs are mounted to the surface of printed circuit boards. In contrast, in the light emitting array of the present invention, at least one LED is embedded into the array itself rather than being mounted to the surface. Embedding the at least one LED into the array provides design and operational advantages. For example, LEDs can be electrically connected using internal traces making up the LED array. As such, the LEDs can be arranged more closely to one another because wire bonding is not necessary for providing an electrical connection to the LED. Additionally, thermal management is aided because heat can be dissipated evenly throughout the diffusion layer and base layer. The diffusion layer can be constructed from a thermally conductive material to further aid in heat dissipation. Further, a ground plane can be added to the array to provide heat sinking. The ground plane size can be adjusted as needed for heat dissipation. An exemplary material of construction for the ground plane is copper penny. Although one of skill in the art will understand that various materials are available for use as a ground plane.

The base layer 4 may be constructed from a conductive metallic material. For example, the base layer 4 may be constructed from aluminum, iron, gold, or copper (e.g., copper foil). The conductivity of the base layer 4 facilitates heat dissipation from the array 2. The base layer 4 may have a thickness of about 0.0005 inches to about 0.0010 inches. For example, the base layer 4 may be about 0.0007 inches in thickness. An exemplary base layer may be half ounce copper foil.

A non-conductive layer of glue or paste 14 may be used to bond the LED 6 to the base layer 4. The glue layer 14 overlies the base layer 4 and thus is interposed between the base layer 4 and the LED 6. The glue layer 14 can include a reflective material to aide in light emission. One of skill in the art will understand that various materials are available for use as an adhesive glue or paste. In another exemplary embodiment, the LED 6 may have bonding pads for adhering the LED 6 to the base layer 4.

In FIG. 1, an array 8 of LEDs is bonded to the base layer 4. However, it will be understood by one of ordinary skill in the art that a single LED 6 bonded to the base layer 4 is within the scope of the invention. Bumps or studs 16 may be present on the LEDs 6 for connection with the glue layer 14 and the base layer 4. As seen in FIG. 1, the LEDs 6 are simply placed on the base layer 4 (e.g., no cavity, opening, or void is formed in the base layer 4 for placement of the LED 6).

As will be explained in greater detail below, LEDs 6 in the LED array 8 may be arranged very close to one another on the base layer 4. The close proximity of the LEDs 6 is possible because wire bonding (which is used in surface mount LED applications) is not needed to provide electrical connection to the LEDs 6. Rather, the LEDs 6 can be electrically connected using internal traces making up the LED array 2. As such, the LEDs 6 can be arranged in a near abutting relationship on the base layer 4. For example, the LEDs 6 can be arranged such that about 40 micron (μm) to about 100 micron spacing is present between the LEDs 6. In another example, spacing between the LEDs 6 may be between about 40 μm to about 80 μm, about 50 μm to about 75 μm, about 50 μm to about 70 μm, or about 60 μm to about 70 μm. Close spacing enables more light to be emitted from a relatively smaller sized LED package.

In FIG. 1, the diffusion layer 10 comprises a transparent material 18 and a luminescent material 12 that is dispersed throughout the transparent material 18. The diffusion layer may be constructed of a thermally conductive material to aid in heat dissipation. The diffusion layer 10 covers the LED array 8 and the base layer 4. The LEDs 6 are fixed by the diffusion layer 10. As used herein, "transparent material" may refer to materials that have 100% light transmissivity but also refers to materials that are semi-transparent, as well. The transparent material can be selected to provide different insulating properties. Exemplary transparent materials include epoxy-based or silicone-based materials (e.g., epoxy resin or pre-preg). Pre-preg is a commonly used term in the art meaning "pre-impregnated" composite fibers. Composite structures built of pre-pregs typically require an oven or autoclave to cure. Exemplary pre-preg materials include FR-4 (Woven glass and epoxy), FR-5 (Woven glass and epoxy), FR-6 (Matte glass and polyester), G-10 (Woven glass and epoxy), CEM-3 (Woven glass and epoxy), CEM-4 (Woven glass and epoxy), and CEM-5 (Woven glass and polyester). Exemplary manufacturers and suppliers of thermally conductive pre-preg include Thermagon, Sekisui, Cofan Taiwan, Bergquist, and Denka. Additional transparent materials are well-known and available to persons of skill in the art.

The thickness of the diffusion layer may vary, depending on the height of components, such as LEDs, being embedded therein. In an exemplary embodiment, the diffusion layer may have a thickness of about 0.5 mm to about 1 mm. For example, the diffusion layer may have a thickness of about 0.5 mm to about 0.75 mm or of about 0.6 mm to about 0.7 mm.

The luminescent material 12 can be dispersed throughout the transparent material 18 such that the luminescent material 12 does not directly coat the LED 6 as a layer of luminescent material. The absence of direct coating of the luminescent material 12 aids in heat dissipation and thermal management for the array 2. The transparent material 18 and luminescent material 12 do not form a composite, but rather the luminescent material 12 is dispersed throughout the transparent material 18. In exemplary embodiments, the luminescent material 12 may be uniformly dispersed throughout the transparent material 18.

The luminescent material can be any desired luminescent material. Persons skilled in the art are familiar with, and have ready access to, a wide variety of luminescent materials. For example, a phosphor is a luminescent material that emits a responsive radiation (e.g., visible light) when excited by a source of exciting radiation. In many instances, the responsive radiation has a wavelength that is different from the wavelength of the exciting radiation. Other examples of luminescent materials include scintillators, day glow tapes and inks that glow in the visible spectrum upon illumination with ultraviolet light.

Luminescent materials can be categorized as being down-converting (i.e., a material which converts photons to a lower energy level (longer wavelength)) or up-converting (i.e., a material which converts photons to a higher energy level (shorter wavelength)). Additionally, in exemplary embodiments, the diffusion layer can further comprise any of a number of well-known additives (e.g., diffusers, scatterers, tints, etc.).

As detailed in U.S. Pat. No. 7,213,940, hereby incorporated by reference, the combination of LEDs and phosphor can be used to produce a high efficiency white light source that provides an acceptable color temperature, good color rendering index, and a wide gamut. Additionally, it will be appreciated by one of ordinary skill in the art that the color of the LEDs and the color and type of the luminescent materials can be selected to provide the desired light output intensity and color.

The surface 20 of the diffusion layer 10 may be finished or a surface effect 22 formed therein to aid in obtaining a predetermined light output and diffusing light. For example, a surface pattern or a region of the surface that is roughened may reside in the surface of the diffusion layer.

Figure 2:
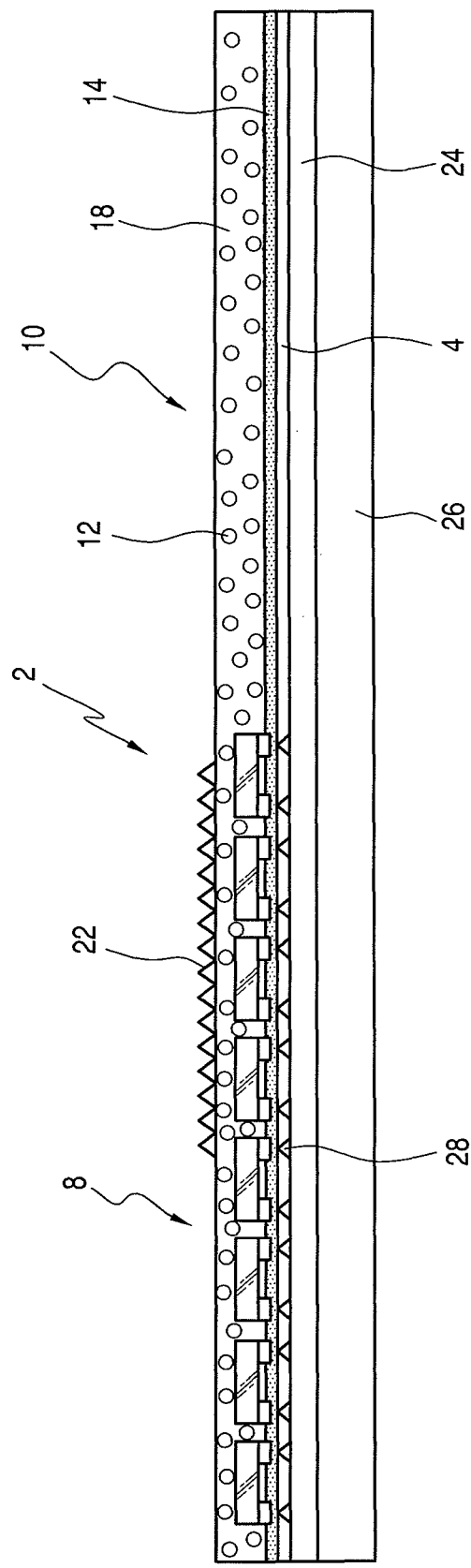
FIG. 2 is a side view schematic representation of the light emitting array of FIG. 1 with additional layers added to the array.

Reference is now made to FIG. 2. FIG. 2 is a side view schematic representation of the light emitting array of FIG. 1 with additional layers added to the array 2. As in FIG. 1, the array 2 comprises the base layer 4, the LED array 8, the glue layer 4, and the diffusion layer 10. It also comprises a substrate layer 24 disposed below the base layer 4 and a ground plane 26. In FIG. 2, from top to bottom, the sequence of layers includes the diffusion layer 10, the LED array 8, the glue layer 14, the base layer 4, the substrate layer 24 and the ground plane 26. The substrate layer 24 enables a higher level of integration in the light emitting array 2 by providing a layer that can have additional components embedded therein. For example, all of the driver level circuitry, including the application-specific integrated circuit (ASIC), can be embedded in the substrate layer 24. It will be understood by the skilled person that multiple additional substrate layers may be included in the array depending on the design purposes of the array.

Embedding of additional components into the array 2 further reduces the size needed for the LED package. Reduction of the total footprint of the LED package is particularly beneficial for smaller form factor applications, such as conventionally-sized light bulbs.

The ground plane 26 can be added to the array 2 as a thermal management tool. The ground plane 26 size can be adjusted to meet thermal requirements. It will be recognized that while the ground layer 26 is in contact with the substrate layer 24 in FIG. 2, it is contemplated that an LED array within the scope of the invention may have the ground plane 26 in contact with the base layer 4 (e.g., in embodiments that do not include a substrate layer or layers).

Micro vias 28 can be formed in the base layer 4 to electrically connect the embedded components, including LEDs 6, to a power source. For example, the vias 28 may be formed in positions that correspond to the bumps or studs 16 formed on the LEDs 6. The vias 28 may be formed by drilling (e.g., using laser or mechanical drilling). The presence of the vias 28 for electrical connection facilitates the absence of wire bonding for providing electrical connection for the LEDs 6. As such, the vias 28 enable closer spacing of the LEDs 6 and thus the ability to have a smaller LED package without sacrificing light output.

In an exemplary embodiment, the light emitting array is a printed circuit board (PCB) with an LED embedded therein.

Reference is now made to FIG. 3. FIG. 3 is a series of side view schematic representations of a light emitting array in accordance with the present invention depicting an exemplary process for manufacturing the light emitting array. Printed circuit board processing and assembly are conventionally performed in a clean environment where the air and components can be kept free of contamination. Most electronic manufacturers have their own proprietary processes, but the following process is an exemplary process that may be used to make a two-sided printed circuit board.

In the exemplary process, a base layer 4 is provided and an LED 6 is provided. In FIG. 3, the LED 6 is an LED array 8. For example, the base layer may be a copper panel. Then a reflective glue layer can be applied to the copper panel to form a so-called adhesive-backed copper foil. The LED array can then be placed on the glue layer using conventional methods (e.g., a chip shooter).

Although not illustrated in FIG. 3, the diffusion layer may be formed as follows. Woven glass fiber is unwound from a roll and fed through a process station where it is impregnated with epoxy resin either by dipping or spraying. For the present invention, this is the stage where the luminescent material (e.g., phosphor) can be added. The impregnated glass fiber then passes through rollers that roll the material to the desired thickness for the finished substrate and also remove any excess resin. The substrate material passes through an oven where it is semicured. After the oven, the material is cut into large panels.

The cut panels can then be stacked in layers, alternating with layers of adhesive-backed copper foil. In the present invention, the diffusion layer is stacked on the LED array and the base layer (as shown in the center figure in FIG. 3). The stacks are then placed in a press where they are subjected to temperatures of about 340° F. (170° C.) and pressures of 1500 psi for an hour or more. This fully cures the resin and tightly bonds the copper foil to the surface of the substrate material. In an exemplary embodiment, the diffusion layer may be a FR-4 prepreg with phosphor dispersed therein.

The following steps can be used to drill and plate holes or micro vias. Several panels of substrate or diffusion layer/base layer, each large enough to make several printed circuit boards, are stacked on top of each other and pinned together to keep them from moving. The stacked panels are placed in a CNC machine, and the holes are drilled according to the pattern determined when the boards were laid out. The holes are then deburred to remove any excess material clinging to the edges of the holes. The inside surfaces of the holes that are designed to provide a conductive circuit from one side of the board to the other are plated with copper. Non-conducting holes are plugged to keep them from being plated or are drilled after the individual boards are cut from the larger panel.

The following steps may be used to create a printed circuit pattern on the diffusion layer/base layer composite. The printed circuit pattern may be created by an "additive" process or a "subtractive" process. In the additive process, copper is plated, or added, onto the surface of the substrate in the desired pattern, leaving the rest of the surface unplated. In the subtractive process, the entire surface of the substrate is first plated, and then the areas that are not part of the desired pattern are etched away, or subtracted.

The following steps may be used for the additive process. The copper foil surface of the substrate or the diffusion layer/base layer composite is degreased. The panels pass through a vacuum chamber where a layer of positive photoresist material is pressed firmly onto the entire surface of the foil. A positive photoresist material is a polymer that has the property of becoming more soluble when exposed to ultraviolet light. The vacuum ensures that no air bubbles are trapped between the foil and the photoresist. The printed circuit pattern mask is laid on top of the photoresist and the panels are exposed to an intense ultraviolet light. Because the mask is clear in the areas of the printed circuit pattern, the photoresist in those areas is irradiated and becomes soluble. The mask is removed, and the surface of the panels is sprayed with an alkaline developer that dissolves the irradiated photoresist in the areas of the printed circuit pattern, leaving the copper foil exposed on the surface of the substrate. The panels are then electroplated with copper. The foil on the surface of the substrate acts as the cathode in this process, and the copper is plated in the exposed foil areas to a thickness of about 0.001-0.002 inches (0.025-0.050 mm). The areas still covered with photoresist cannot act as a cathode and are not plated. Tin-lead or another protective coating is plated on top of the copper plating to prevent the copper from oxidizing and as a resist for the next manufacturing step. The photoresist is stripped from the boards with a solvent to expose the substrate's copper foil between the plated printed circuit pattern. The boards are sprayed with an acid solution that eats away the copper foil. The topper plating on the printed circuit pattern is protected by the tin-lead coating and is unaffected by the acid.

Additionally, the surface 20 of the diffusion layer 10 can be finished to obtain a predetermined light output. Surface finishing may include providing surface patterns or providing a roughened area in a portion of the surface.

If more layers are desired, additional substrate layers can be added to the diffusion layer/base layer composite in the manner described above. For example, the above-described composite may be flipped over for application of a substrate layer onto the base layer and/or for drilling of micro vias in the base layer to enable electrical connection to the LED array 8 and other components. One of ordinary skill in the art will understand how to build layers as desired. Additional components (e.g., driver circuitry) can be embedded in the substrate layer 24. A ground plane 26 can also be applied to the substrate layer 24. The size of the ground plane 26 is variable and can be adjusted based on the thermal requirements.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. An LED array comprising
   (a) a base layer;
   (b) at least one LED disposed on the base layer;
   (c) a diffusion layer including a luminescent material, the diffusion layer covering the at least one LED and the base layer in such a way that light emitted from the at least one LED passes through the diffusion layer, and
   (d) a substrate layer disposed below and in contact with the base layer in the array,
   wherein the diffusion layer comprises composite fibers wherein the at least one LED is embedded within the diffusion layer, and wherein a component is embedded in the substrate layer.

2. The array of claim 1, wherein the diffusion layer comprises a transparent material having a luminescent material dispersed therein.

3. The array of claim 2, wherein the luminescent material comprises phosphor.

4. The array of claim 1, further comprising a glue layer bonding the at least one LED to the base layer, wherein the glue layer overlies the base layer.

5. The array of claim 1, wherein the glue layer comprises reflective material.

6. The array of claim 1, wherein the base layer comprises copper foil.

7. The array of claim 1, wherein the at least one LED comprises an array of LEDs.

8. The array of claim 7, wherein spacing between the LEDs in the array is between about 40 microns to about 100 microns.

9. The array of claim 1, wherein the diffusion layer comprises transparent epoxy resin having phosphor dispersed therein.

10. The array of claim 1, wherein the base layer has a micro via residing therein.

11. The array of claim 1, wherein the component comprises driver circuitry.

12. The array of claim 1, further comprising a ground plane.

13. The array of claim 1, wherein the light emitting array is a printed circuit board with at least one LED embedded therein.

14. The array of claim 1, wherein a surface effect resides on a surface of the diffusion layer such that the array produces a predetermined light output.

15. The array of claim 14, wherein the surface effect comprises a roughened surface region.

16. The array of claim 14, wherein the surface effect comprises a surface pattern.

17. A process for manufacturing an LED array, the process comprising
   (a) providing a base layer;
   (b) placing at least one LED on the base layer; and
   (c) stacking a diffusion layer in covering relation to the at least one LED and the base layer, the diffusion layer comprising a transparent material including a luminescent material dispersed therein, and
   (d) adding a substrate layer to the LED array, wherein the substrate layer is disposed below and in contact with the base layer;
   wherein the diffusion layer comprises composite fibers, wherein the at least one LED is embedded within the diffusion layer, and wherein the substrate layer includes a component embedded therein.

18. The process of claim 17, further comprising drilling a micro via in the base layer.

19. The process of claim 17, further comprising adding a ground layer to the LED array, wherein the ground layer is disposed below and in contact with the substrate layer.

20. The process of claim 17, further comprising adding a ground layer to the LED array, wherein the ground layer is in contact with and below the base layer.

21. The process of claim 17, wherein the LED array comprises a printed circuit board having at least one LED embedded therein.

22. The process of claim 17, wherein the at least one LED is bonded to the base layer by a glue layer overlying the base layer.

23. The process of claim 22, wherein the glue layer comprises a reflective material.

24. The process of claim 17, wherein the luminescent material comprises phosphor.

* * * * *